United States Patent
Denzene et al.

[19]

[11] Patent Number: 5,867,371
[45] Date of Patent: Feb. 2, 1999

[54] COVER MEMBER FOR SEALED CIRCUIT BOARD ASSEMBLY

[75] Inventors: Quentin S. Denzene, Apex; Edwin J. Nealis, Cary, both of N.C.

[73] Assignee: Ericsson Inc., Research Triangle Park, N.C.

[21] Appl. No.: 939,540

[22] Filed: Sep. 29, 1997

[51] Int. Cl.⁶ ..................................................... H05K 9/00
[52] U.S. Cl. .......................... 361/816; 361/748; 361/800; 174/35 GC
[58] Field of Search ..................................... 361/748, 752, 361/800, 816, 818; 174/35 R, 35 GC, 35 MS; 439/607–610; 206/706–709

[56] References Cited

U.S. PATENT DOCUMENTS

| 5,031,076 | 7/1991 | Kiku .......................................... 361/816 |
| 5,261,826 | 11/1993 | Leeb et al. ................................. 439/67 |
| 5,436,803 | 7/1995 | Annis et al. .............................. 361/818 |
| 5,527,989 | 6/1996 | Leeb ........................................... 174/35 |
| 5,557,064 | 9/1996 | Isern-Flecha et al. ............. 174/35 MS |
| 5,639,989 | 6/1997 | Higgins, III . |
| 5,739,463 | 4/1998 | Diaz et al. ............................ 174/35 R |

FOREIGN PATENT DOCUMENTS

| 0 781 085 A1 | 6/1997 | European Pat. Off. . |
| 40 41 071 A1 | 6/1991 | Germany . |
| 43 26 825 A1 | 6/1994 | Germany . |
| 1088408 | 7/1966 | United Kingdom . |

*Primary Examiner*—Leo P. Picard
*Assistant Examiner*—Jayprakash N. Gandhi
*Attorney, Agent, or Firm*—Jenkens & Gilchrist

[57] ABSTRACT

A multi-layered laminate structure forms a cover member that is capable of being sealed around the edges of a circuit board, around connector assemblies mounted on the circuit board, and against a mounting panel to which the circuit board is attached, to provide a sealed environment for electrical components mounted on the circuit board.

16 Claims, 8 Drawing Sheets

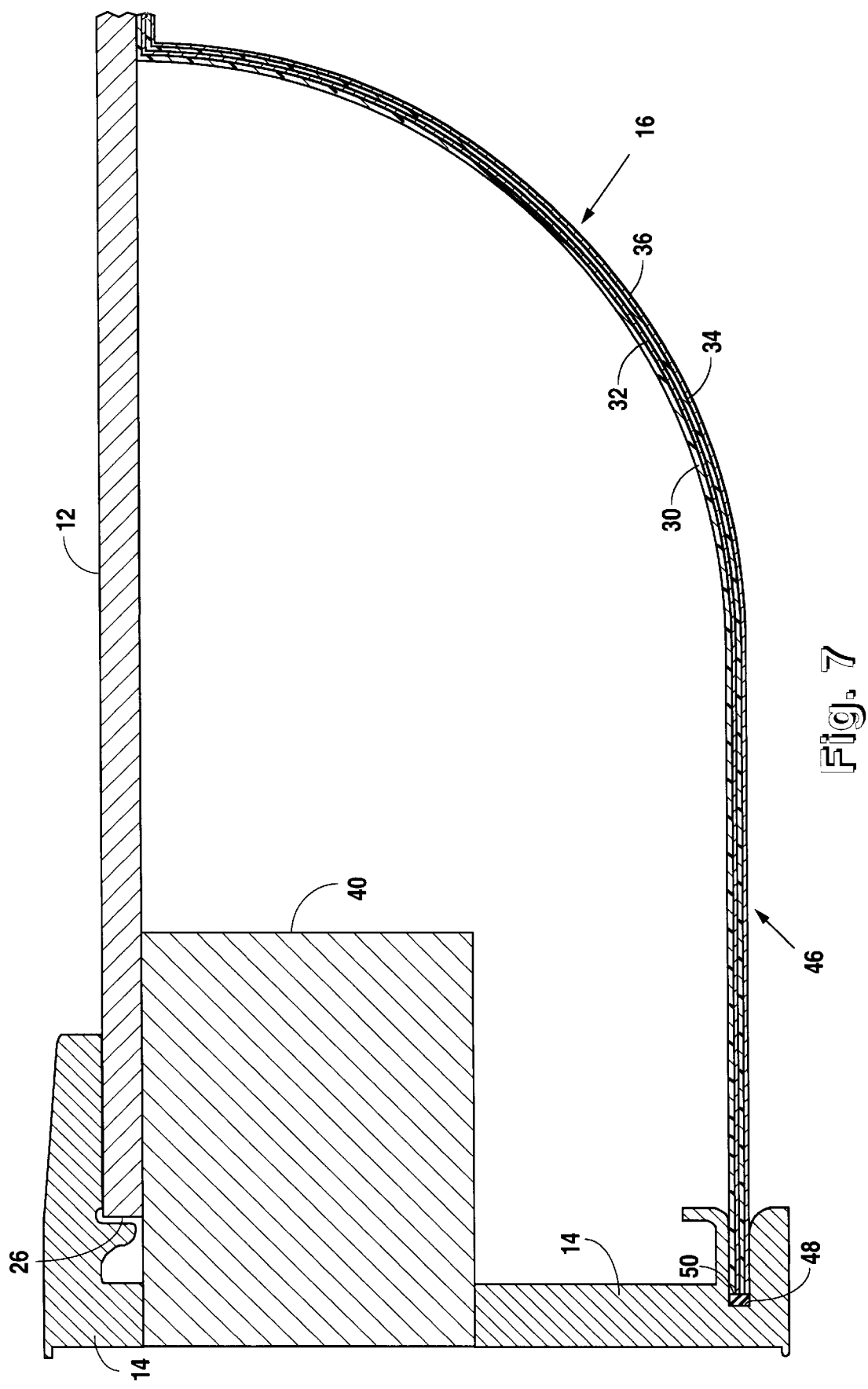

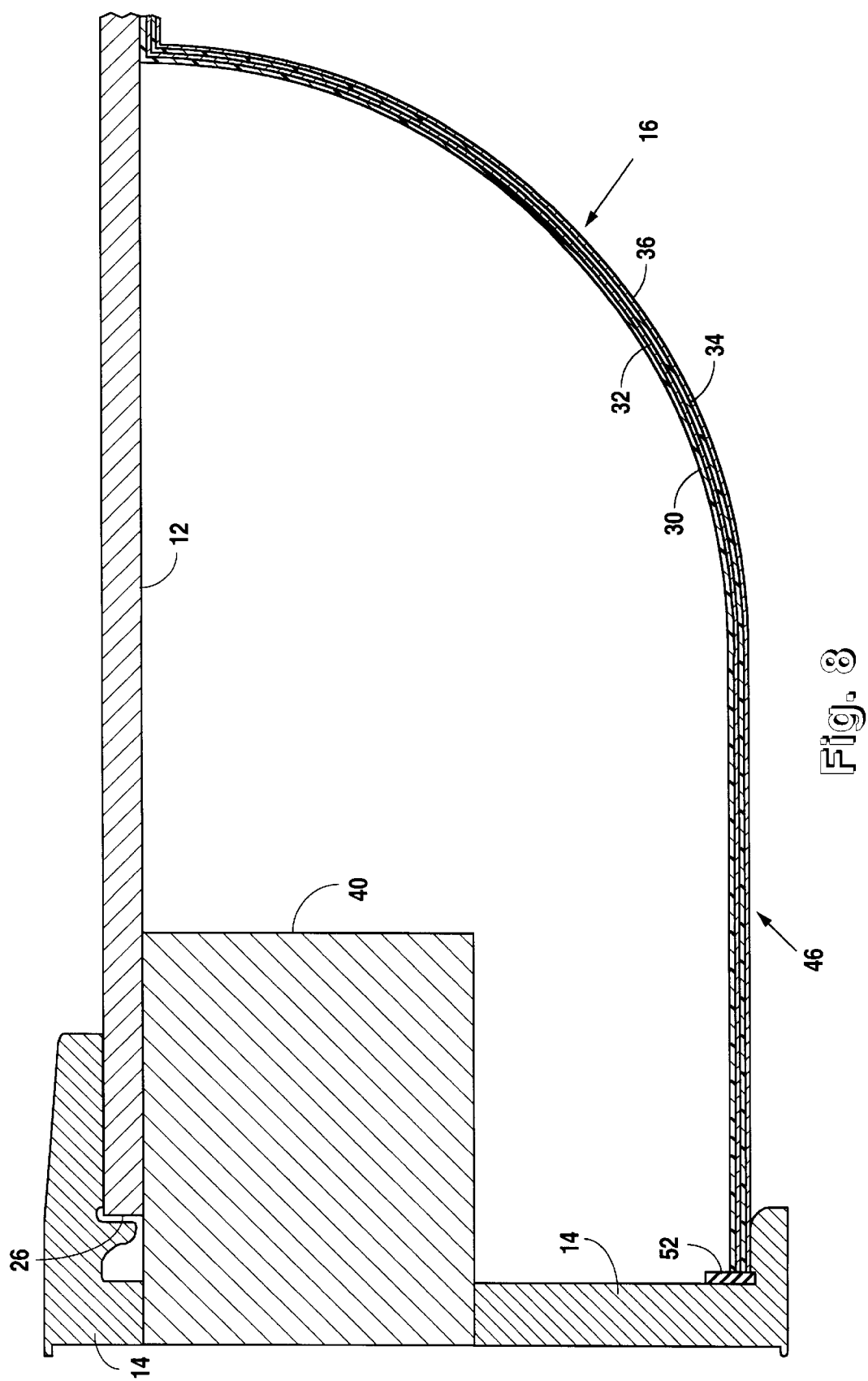

COVER MEMBER FOR SEALED CIRCUIT BOARD ASSEMBLY

BACKGROUND OF THE INVENTION

1. Technical Field

This invention relates generally to a cover member for sealing one side of a circuit board, and more particularly, to such a cover member that has a multi-layered laminate structure.

2. Background Art

Electrical instruments, and radio equipment in particular, used in outdoor environments are subjected to severe weather conditions and harsh operational demands. Typically, a cabinet or an enclosure of some type is used to enclose the radio equipment and provide a weather-resistant housing for the electronic components of the equipment. The interior environment of the cabinet is often controlled to a level suitable for the enclosed electronic equipment and components. For example, the inside environment may be air-conditioned, fan-cooled, or heated. Many environmental control systems are sealed and use closed-system air conditioners and heat exchangers to prevent outside air from entering the enclosure. In applications where the complexity and/or cost of the sealed systems is prohibitive, outside air is generally used directly to cool the equipment inside the enclosure. Unfortunately, atmospheric air often contains many substances that will attack radio equipment, such as water, nitrates, hydrocarbons, sulphur dioxide, nitrogen oxides, hydrogen sulphide, chlorine, ozone, and salt.

Several methods are used for protecting circuit boards from harsh ambient environments. Conformal coatings have been used successfully for many years. Conformal coatings cover an entire circuit board to seal and protect the components on the board as well as the board itself. In this method, the circuit board is dipped or sprayed with a specified coating. However, it has been found that this method sometimes leaves small holes or gaps in the coating, and can have an uneven buildup of material, creating problems for handling and circuit performance. More recently, vacuum deposition has been used to build up the protective layer at a molecular level. However, vacuum deposition is an expensive and time-consuming process, and requires a significant capital investment in specialized equipment.

Potting is another form of conformal coating wherein the circuit board is permanently fixed inside a small box or frame and potting compound poured over and around the board, imbedding it completely in the compound. However, potted circuit boards require increased physical space and make repair of the circuit board very difficult, if not impossible.

Placing the circuit board within an air-tight enclosure is also a method of sealing the circuit board. For example, U.S. Pat. No. 5,527,989, issued Jun. 18, 1996 to Karl-Erik Leeb, describes a device for encapsulating electronic components. However, although a circuit board can be encapsulated within the described device, all components that require visual or physical accessibility, such as connector assemblies, are not covered and hence not protected from airborne contaminants.

Cold welding may also be used to seal a metal enclosure, or special adhesives can be used to seal metal or other materials which form the enclosure. However, these structures also require considerable physical space for the sealed product and can be a costly solution, depending on the complexity of the assembled components and the degree of hermeticity required.

The present invention is directed to overcoming the problems set forth above. It is desirable to have a cover for a circuit board that cooperates with the circuit board to provide a sealed circuit board assembly. It is also desirable to have such a cover and sealed circuit board assembly wherein electrical components on the circuit board are sealed from the ambient environment while still providing access to connector assemblies mounted on the circuit board. It is also desirable to have such a cover and sealed circuit board assembly that does not require increased space within an instrument housing in which the circuit board is mounted.

SUMMARY OF THE INVENTION

In accordance with one aspect of the present invention, a cover member for sealing one side of a circuit board having at least one connector assembly disposed on a peripheral margin at one side of the circuit board, comprises a multi-layered laminate structure. The laminate structure has a first layer formed of an electrically non-conductive polymer adapted for bonding with pre-selected portions of the circuit board, a second layer formed of a material having electromagnetic radiation shielding properties and bonded to the first layer, a third layer formed of an electrically non-conductive polymer bonded to the second layer, and a fourth layer formed of an electrically conductive material and bonded to the third layer. The multi-layered laminate structure further includes a first portion adapted to sealingly surround an outer surface portion of the connector assembly disposed on the circuit board, and an edge portion adapted to sealingly abut a face panel to which the circuit board is mounted.

Other features of the cover member embodying the present invention include the first portion of the laminate structure being adapted to abut a seal positioned between the outer surface portion of the connector and the cover member or, alternatively, be bonded to the outer surface portion of the connector assembly. Other features include the edge portion of the laminate structure being adapted to sealingly abut a seal either disposed within a groove formed in the face panel, or disposed on a surface of the face panel.

In accordance with another aspect of the present invention, a sealed circuit board assembly includes a panel adapted to receive a circuit board, a circuit board attached to the panel, and a cover member. The circuit board has a surface as defined by edges and which has substantially planar margins disposed adjacent first defined portions of the edges. The circuit board further includes at least one electrical connector assembly mounted on a planar margin of the surface disposed adjacent a second defined portion of a preselected one of the edges of the circuit board. The connector assembly has an outer surface portion spaced from the surface of the circuit board. The cover member is a multi-layered laminate structure having a first layer formed of an electrically non-conductive polymer having portions thereof bonded to the planar margins of the circuit board, a second layer formed a material having electromagnetic radiation shielding properties and bonded to the first layer, a third layer formed of an electrically non-conductive polymer and bonded to the second layer, and a fourth layer formed of an electrically conductive material bonded to the third layer. The cover member further includes a first portion adapted to sealingly surround the outer surface portion of the connector assembly and an edge portion adapted to sealingly abut the panel.

Other features of the sealed circuit board assembly embodying the present invention include a seal positioned between the outer surface portion of the connector assembly and the cover member or, alternatively, the cover member being directly bonded to the outer surface portion of the connector assembly. Other features include a seal member positioned between a panel to which the circuit board is attached and an edge portion of the cover member that is adapted to sealingly abut the panel. Still another feature includes the cover member having predefined portions spaced inwardly from the planar margins of the circuit board and spaced from the surface of the circuit board at a distance sufficient to provide clearance between the cover member and the electrical component mounted on the circuit board.

BRIEF DESCRIPTION OF THE DRAWINGS

A more complete understanding of the structure and operation of the present invention may be had by reference to the following detailed description when taken in conjunction with the accompanying drawings, wherein:

FIG. 7 is a sectional view of a portion of the sealed circuit board assembly embodying the present invention, showing the circuit board, front panel, seal, and cover member components of the assembly; and FIG. 8 is a sectional view of a portion of the sealed circuit board assembly embodying the present invention, showing another embodiment of the circuit board, front panel, seal, and cover member components of the assembly.

DETAILED DESCRIPTION OF PRESENTLY PREFERRED EXEMPLARY EMBODIMENTS

Figure 1:
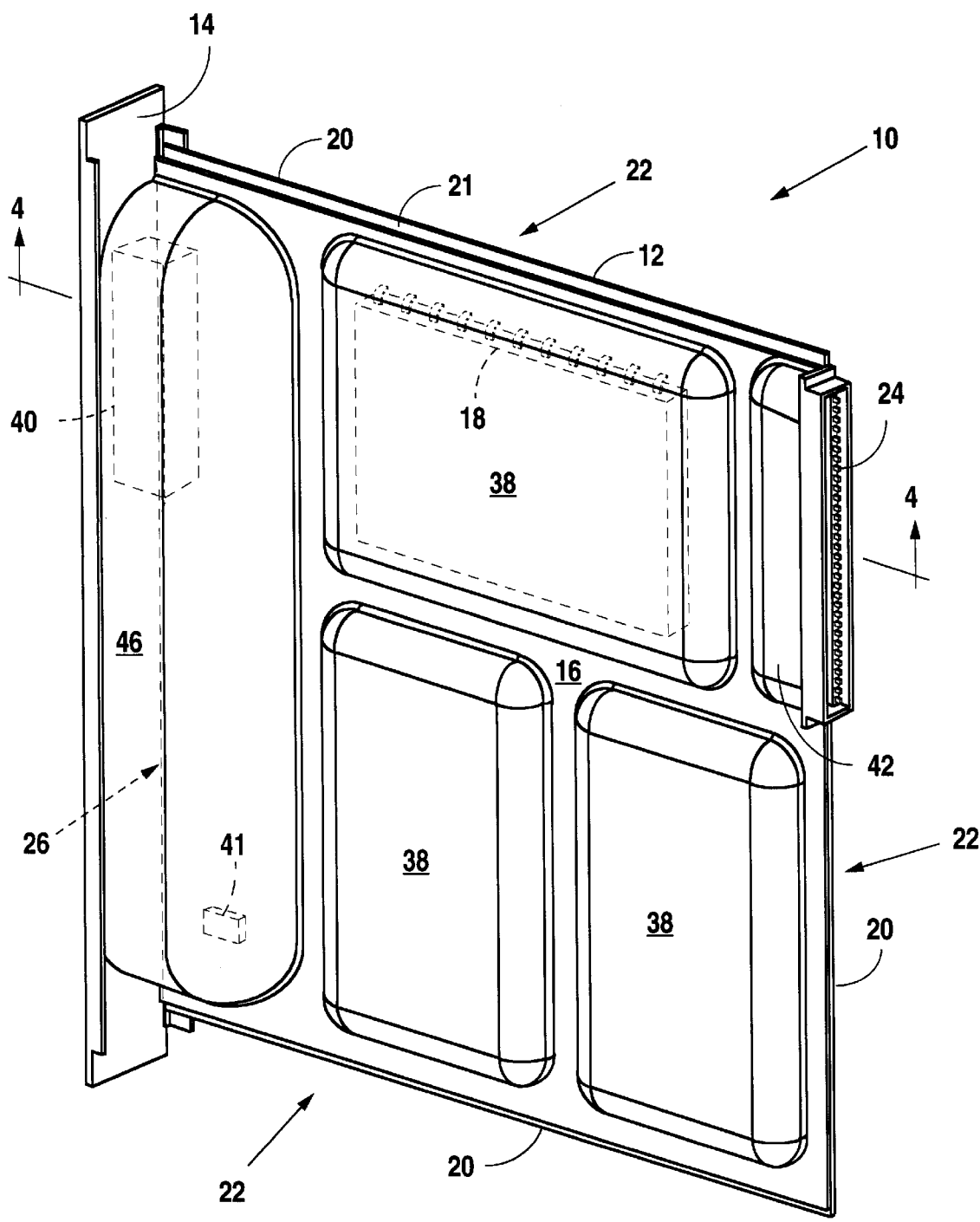
FIG. 1 is a perspective view of a sealed circuit board assembly embodying the present invention.
Figure 2:
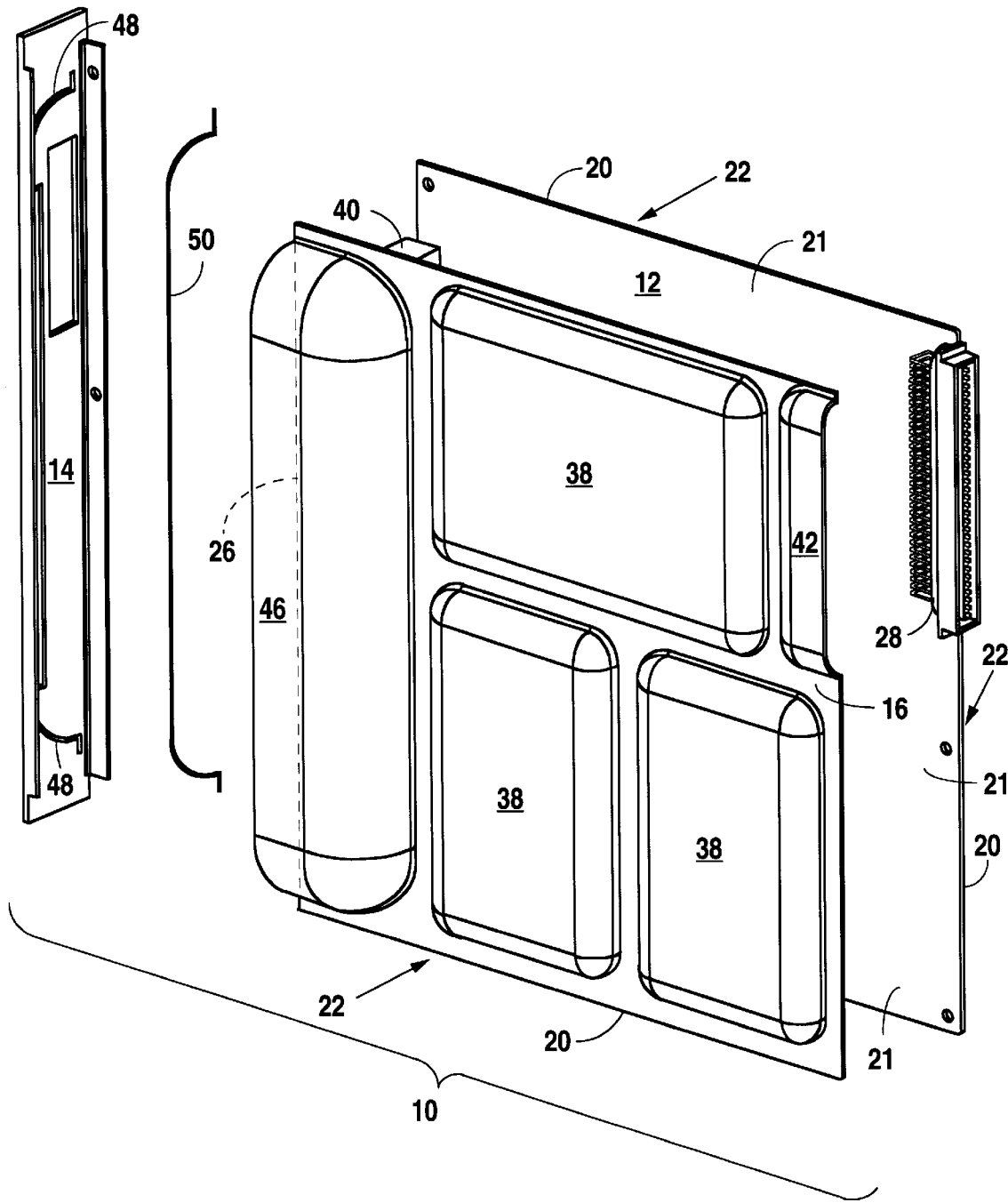
FIG. 2 is an exploded perspective view of the sealed circuit board assembly embodying the present invention.
Figure 3:
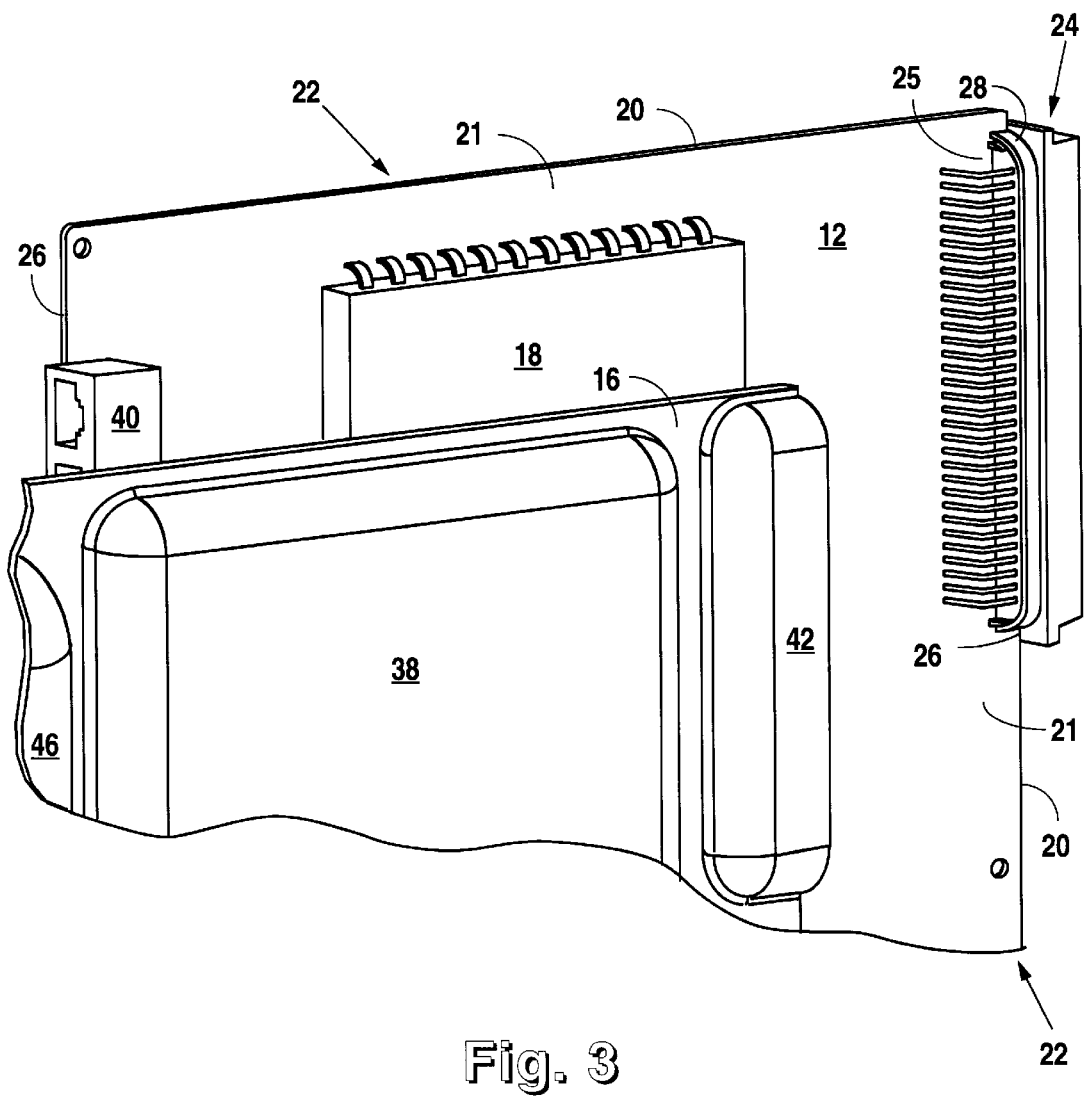
FIG. 3 is an exploded perspective view of a portion of the sealed circuit board assembly embodying the present invention.

In the preferred embodiment of the present invention, a sealed circuit board assembly 10 includes a circuit board 12 that is attached to a panel 14, such as a face panel as shown in FIG. 1, and a cover member 16. The circuit board 12 has a plurality of electrical components 18 mounted on a surface of the circuit board that is defined by edges 20 that have substantially planar margins 21 disposed adjacent first defined portions 22 of the edges 20. The circuit board 12 also has at least one electrical connector assembly 24 mounted on a planar margin 25 of the circuit board surface that is disposed adjacent a second defined portion 26 of the edges 20. As shown in FIG. 2 of the illustrative embodiment, the connector assembly 24 is a 96 pin DIN-type connector that is mounted on a circuit board. The connector 24 provides electrical communication between circuits on the circuit board 12 and a backplane, not shown, connectable with the connector assembly 24. The connector assembly 24 is mounted on the circuit board 12 and has an outer surface portion 28 that is spaced from the surface of the circuit board 12.

The cover member 16 is preferably a multi-layered laminate structure which, in the illustrative preferred embodiment, comprises four layers. A first, or inner, layer 30 is formed of an electrically non-conductive polymer, for example, an ionomer resin such as SURLYN® produced by DuPont. In the illustrative embodiment, the first layer 30 has a thickness of about 0.24 mm. SURLYN® is particularly desirable because of its high hot tack strength, low sealing temperature, and excellent formability/deep draw characteristics which when deformed, resist pinholing. In particular, SURLYN® ionomer resin is directly bondable to the planar regions 21 adjacent the first defined portions 22 of the edges 20 of the circuit board 12. The cover member 16 further includes a second layer 32 formed of an electrically conductive material, such as brass, having electromagnetic radiation shielding properties to prevent propagation of radio frequency (RF) energy through the cover member 16, and is bonded to the first layer 30. In the illustrative embodiment, the second layer 32 has a thickness of about 0.10 mm.

The laminate structure of the cover member 16 also includes a third layer 34 formed of an ionomer resin such as described above with reference to the first layer 30. In the preferred exemplary embodiment, the third layer electrically non-conductive polymer has a thickness of about 0.06 mm. The laminate structure of the cover member 16 further comprises a fourth, or outer, layer 36 formed of an electrically conductive material. In the preferred illustrative embodiment, the outer layer 36 is formed of stainless steel having a thickness of about 0.10 mm. The stainless steel outer layer 36 advantageously provides an oxidation resistant covering that increases the structural stiffness of the cover for enhanced protection of the enclosed components. Thus, the overall thickness of the cover member 16 is about 0.50 mm and, in addition to sealing the surface of the circuit board 12, provides a protective, substantially rigid, cover over the electrical components 18 mounted on the circuit board 12. Even though the cover member 16 is substantially rigid, it is readily formed by stamping or pressing to provide the desired contoured shapes in one or more predefined portions 38 that, when the cover member 16 is bonded to the circuit board 12, is spaced from the surface of the circuit board 12 at a distance sufficient to provide clearance between the cover member 16 and the electrical components 18 mounted on the circuit board 12, as well as edge-mounted features such as the connector assembly 24.

In the preferred embodiment of the present invention, as shown in the drawings, the circuit board 12 is attached to a front panel 14 which forms a component of the control radio interface of the above-mentioned radio base station. Typically, the front panel 14 is formed of aluminum and, in the illustrated embodiment has a second connector assembly 40 adapted to receive one or more connector plugs. Also, a switch, fuse, or other accessible component 41, may also be mounted on the circuit board at a position adjacent the front panel 14.

Figure 4:
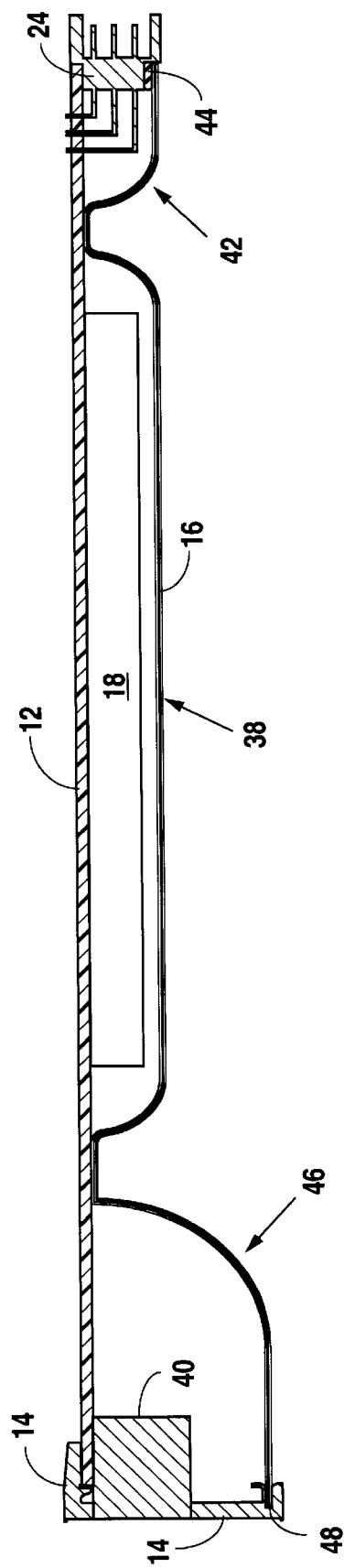
FIG. 4 is a cross-sectional view of the sealed circuit board assembly embodying the present invention taken along the line 4—4 of FIG. 1.
Figure 5:
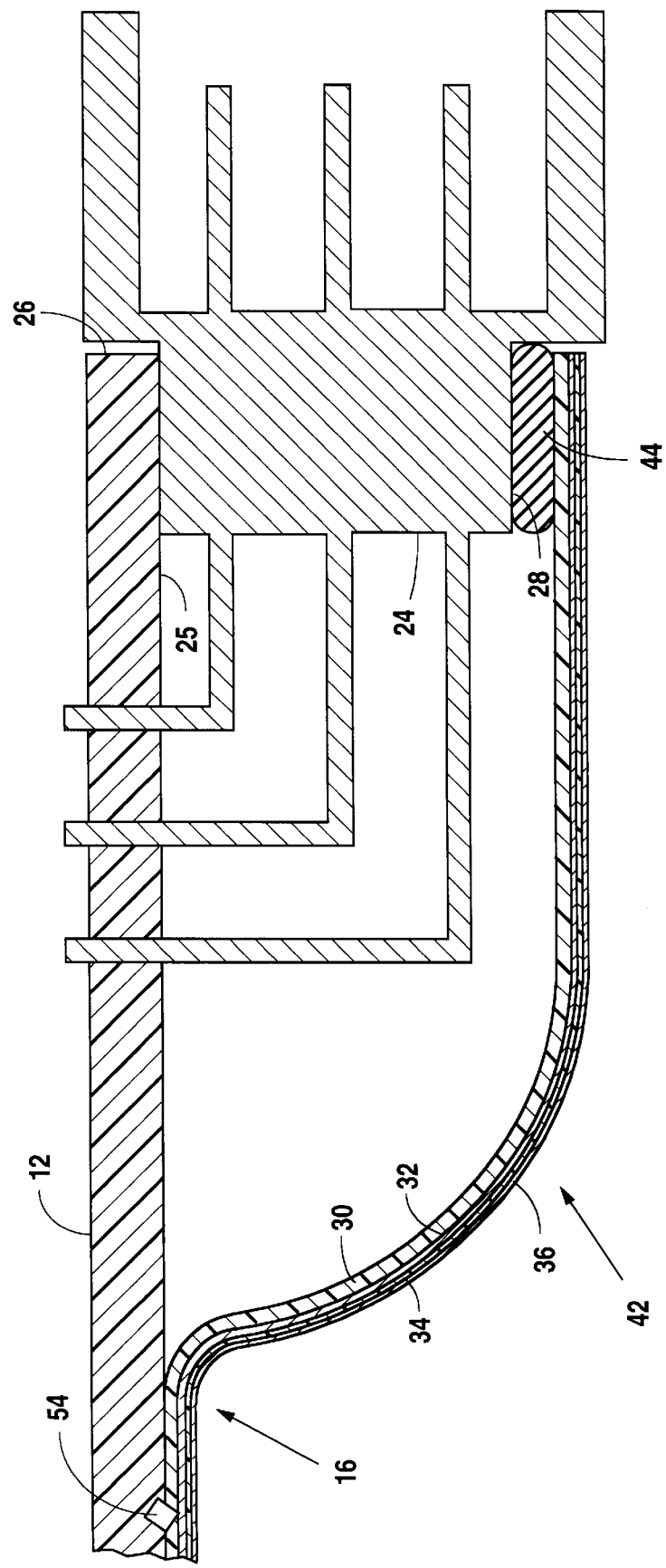
FIG. 5 is a sectional view of a portion of the sealed circuit board assembly embodying the present invention, showing the circuit board, connector, seal, and cover member components of the assembly.

In the present embodiment, the cover member 16, in addition to having formed predefined portions 38 adapted to provide a clearance for electrical components 18, also has a first formed edge portion 42 that is adapted to mate with the outer surface portion 28 of the connector assembly 24. In a first embodiment, as shown in FIGS. 4 and 5, the sealed circuit board assembly 10 includes a resiliently compressible seal member 44 that is positioned between the outer surface 28 of the connector assembly 24 and the first layer 30 of the predefined portion 38 of the cover member 16. In a second embodiment, shown in FIG. 6, the first layer 30 of the cover member 16 is directly bonded to the outer surface portion 28 of the connector assembly 14, either by heat fusion or adhesive joining.

In another embodiment of the present invention, the cover member 16 has a second formed edge portion 46 that is shaped to protectively surround a portion of the second connector assembly 40 mounted on the circuit board 13 at another second defined portion 26 of the circuit board 12, adjacent the front panel 14. In one arrangement, the front panel 14 has a groove 48 formed on the interior surface of the panel 14 that is shaped to receive the second formed edge portion 46 of the cover member 16. As shown in FIG. 7, the groove 48 preferably has an elastomeric seal 50 disposed in the bottom of the groove 48. In another arrangement, a flat face seal 52 is positioned on the inside surface of the panel 14 between the second formed edge portion 46 of the cover member 16 and the panel 14.

Figure 6:
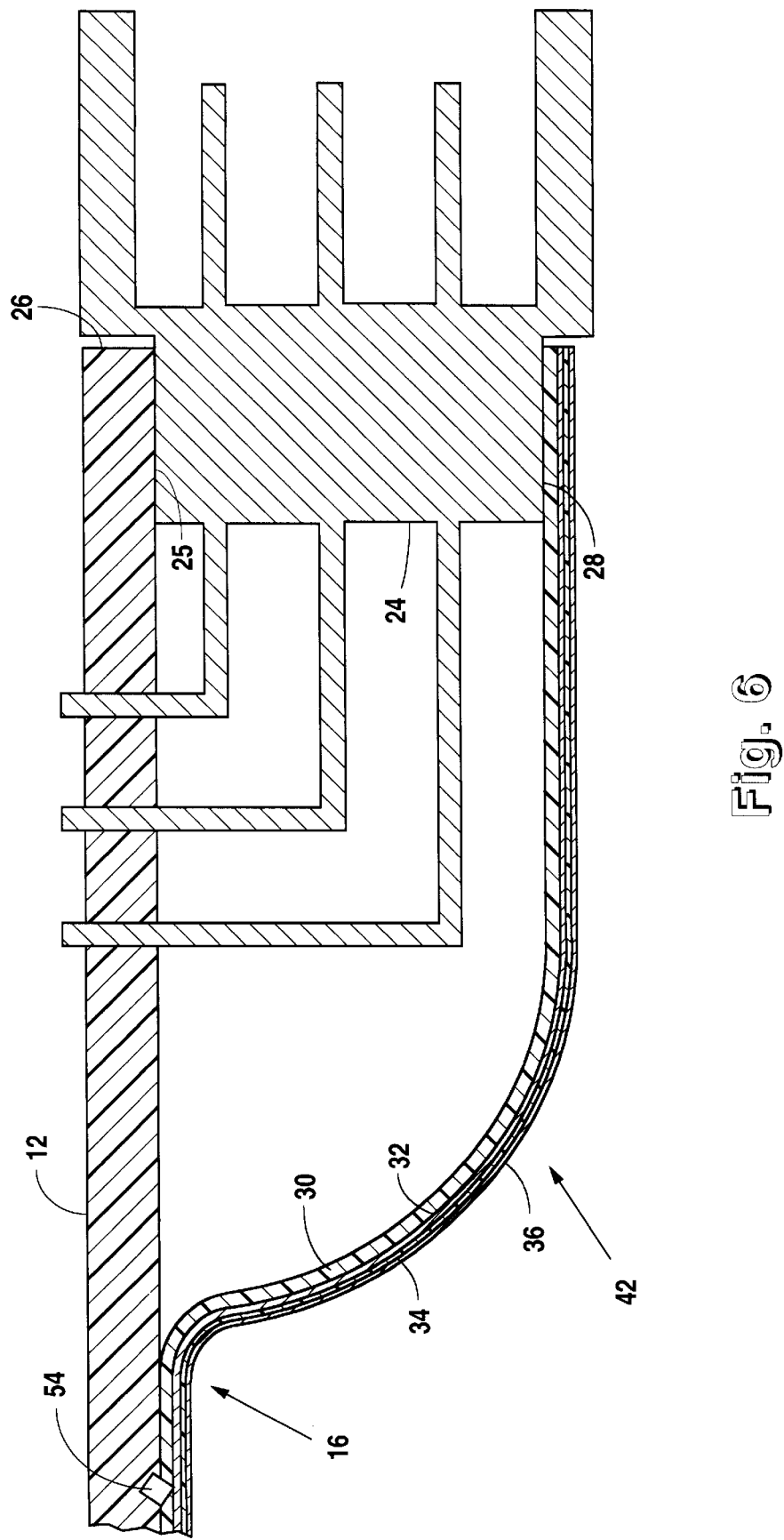
FIG. 6 is a sectional view of a portion of the sealed circuit board assembly embodying the present invention, showing the cover member directly bonded to the outer periphery of the connector.

Desirably, the ground plane circuitry of the circuit board 12 is electrically connected to the electrically conductive second layer 32 of the cover member 16. In the present invention, a grounding wire 54 is desirably connected to the ground plane of the circuit board 12 and either extends from, or rests on, the surface of the circuit board 12, as shown in FIGS. 5 and 6. When the cover member 16 is assembled to the circuit board 12, preferably by pressure-heat bonding, a portion of the first layer 30 of the cover member 16 is displaced providing direct electrical communication between the electrical lead 54 and the electrically conductive second layer 32 of the cover member 16. The portion of the first layer 30 that is displaced, is the area that is directly aligned with the electric lead 54 prior to bonding.

Thus, it can be seen that the cover member 16 provides an air-tight seal between the external environment and electrical components 18 mounted on the circuit board 12. The circuit board 12 is completely sealed around its periphery by being either directly bonded with the first layer 30 of the cover member 16, or by a combination of direct bonding and elastomeric seals 44, 50, 52. Furthermore, it can be seen that the cover member 16 advantageously provides a structural barrier between the external environment and electrical components 18 mounted on the circuit board 12.

Although the present invention is described in terms of preferred exemplary embodiments, with specific materials suggested for construction of the laminated structure of the cover, specific connector assembly arrangements, and specific panel constructions and mounting arrangements for the circuit board to a front panel, those skilled in the art will recognize that changes in those materials, connector assemblies, panels and mounting arrangements, may be made without departing from the spirit of the invention. For example, different electrically conductive and non-conductive materials may be used for formation of the cover assembly, and different connector assembly arrangements, may be made without departing from the spirit of the invention. Such changes are intended to fall within the scope of the following claims.

Other aspects, features, and advantages of the present invention may be obtained from a study of this disclosure and the drawings, along with the appended claims.

What we claim is:

1. A cover member adapted for sealing one side of a circuit board defined by edges that include a first edge adapted for mounting to a face panel and at least one connector assembly disposed on a peripheral margin of said one side of the circuit board at a position adjacent another edge of the circuit board, said connector assembly having an outer surface portion spaced from said one side of the circuit board, said cover member comprising:

a substantially rigid multilayered laminate structure having a first layer formed of an electrically nonconductive polymer adapted for bonding with preselected portions of said circuit board, a second layer formed of a material having electromagnetic radiation shielding properties and bonded to said first layer, a third layer formed of an electrically nonconductive polymer bonded to said second layer, and a fourth layer formed of an electrically conductive material and bonded to said third layer;

a first portion of said laminate structure adapted to sealingly surround said outer surface portion of connector assembly; and an edge portion of said laminate structure adapted to sealingly abut said face panel.

2. A cover member, as set forth in claim 1, wherein said first portion of the laminate structure comprising said cover member is adapted to abut a seal positioned between the outer surface portion of said connector assembly and said cover member.

3. A cover member, as set forth in claim 1, wherein the first layer of said laminate structure comprising the cover member is bondable with the outer surface portion of said connector assembly.

4. A cover member, as set forth in claim 1, wherein the edge portion of said laminate structure comprising the cover member is adapted to sealingly abut a seal disposed within a groove formed on said face panel.

5. A cover member, as set forth in claim 1, wherein said edge portion of said laminate structure comprising the cover member is adapted to sealingly abut a seal disposed on a surface of said face panel.

6. A cover member, as set forth in claim 1, wherein said one side of the circuit board has a plurality of substantially planar peripheral margins adjacent each edge of the circuit board, and the first layer of said laminate structure comprising the cover member has peripheral margins adapted for bonding with each of the peripheral margins of the circuit board.

7. A cover member, as set forth in claim 6, wherein said cover member has at least one portion spaced inwardly from said peripheral margins that is shaped to be spaced from said one side of the circuit board when the peripheral margin of the first layer of said laminated structure of the cover member are bonded to the peripheral margins of said circuit board.

8. A cover member, as set forth in claim 6, wherein said circuit board has at least one electrical lead extending outwardly from said one side of the circuit board, and said second layer of the laminate structure comprising the cover member is electrically connectable with said at least one electrical lead in response to pressure bonding said cover member to said circuit board and displacing a portion of the first layer of said laminated structure comprising the cover member that, prior to said pressure bonding, is aligned with said at least one electrical lead.

9. A cover member adapted for sealing one side of a circuit board defined by edges that include a first edge adapted for mounting to a face panel and at least one connector assembly disposed on said first edge of the circuit board at a position adjacent said face panel, said cover member comprising:

a substantially rigid multilayered laminate structure having a first layer formed of an electrically nonconductive polymer adapted for bonding with preselected portions of said circuit board, a second layer formed of a material having electromagnetic radiation shielding properties and bonded to said first layer, a third layer formed of an electrically nonconductive polymer bonded to said second layer, and a fourth layer formed of an electrically conductive material and bonded to said third layer, said multilayered laminate structure having an edge portion adapted to protectively surround a portion of said connector assembly and sealingly abut said face panel.

10. A cover member, as set forth in claim 9, wherein the edge portion of said laminate structure comprising the cover member is adapted to sealingly abut a seal disposed within a groove formed on said face panel.

11. A cover member, as set forth in claim 9, wherein said edge portion of said laminate structure comprising the cover member is adapted to sealingly abut a seal disposed on a surface of said face panel.

12. A sealed circuit board assembly, comprising:
a panel adapted to receive a circuit board;
a circuit board attached to said panel and having a plurality of electrical components mounted on a surface of the circuit board, said surface being defined by edges with substantially planar margins disposed adjacent first defined portions of the edges, and at least one electrical connector assembly mounted on a planar margin of said surface disposed adjacent a second defined portion of a preselected one of said edges of the circuit board, said connector assembly having an outer surface portion spaced from said surface of the circuit board;
a cover member having a multilayered laminate structure comprising a first layer formed of an electrically nonconductive polymer having portions thereof bonded to said planar margins adjacent the first defined portions of the edges of the circuit board, a second layer formed of a material having electromagnetic radiation shielding properties bonded to said first layer, a third layer formed of an electrically nonconductive polymer bonded to said second layer, and a fourth layer formed of an electrically conductive material bonded to said third layer, a first portion adapted to sealingly surround said outer surface portion of the connector assembly; and an edge portion adapted to sealingly abut said panel.

13. A sealed circuit board assembly, as set forth in claim 12, wherein said sealed circuit board assembly includes a seal positioned between the outer surface portion of said connector assembly mounted on the circuit board and said cover member.

14. A sealed circuit board assembly, as set forth in claim 12, wherein said cover member is bonded to the outer surface portion of said connector assembly mounted on the circuit board and said cover member.

15. A sealed circuit board assembly, as set forth in claim 12, wherein said sealed circuit board assembly includes a seal member disposed between said panel and said edge portion of the cover member adapted to sealingly abut said panel.

16. A sealed circuit board assembly, as set forth in claim 12, wherein said laminate structure comprising said cover member has predefined portions spaced inwardly from said portions of the first layer bonded to the planar margins of the circuit board and spaced from said surface of the circuit board at a distance sufficient to provide clearance between said laminate structure and the electrical components mounted on said circuit board.

* * * * *